United States Patent
Liu et al.

(10) Patent No.: US 6,515,607 B2
(45) Date of Patent: Feb. 4, 2003

(54) DELTA-SIGMA MODULATOR

(75) Inventors: Shen-Iuan Liu, Taipe (TW);
Chien-Hung Kuo, Taipei (TW);
Tzu-Chien Hsueh, Taipei (TW);
Hsiang-Hui Chang, Taipei Hsien (TW)

(73) Assignee: Archic Tech, Corp., Taipei (TW)

( * ) Notice: Subject to any disclaimer, the term of this patent is extended or adjusted under 35 U.S.C. 154(b) by 0 days.

(21) Appl. No.: 10/101,263

(22) Filed: Mar. 18, 2002

(65) Prior Publication Data

US 2002/0180629 A1 Dec. 5, 2002

(30) Foreign Application Priority Data

May 25, 2001 (TW) ........................................ 90112613 A (51) Int. Cl.$^7$ ............................................... H03M 3/00
(52) U.S. Cl. ...................... 341/143; 341/118; 341/120; 341/144; 341/155
(58) Field of Search ................................ 341/143, 144, 341/155–172, 118, 120

(56) References Cited

U.S. PATENT DOCUMENTS

| | | | | |
|---|---|---|---|---|
| 5,311,181 A | * | 5/1994 | Ferguson et al. | 341/143 |
| 5,442,353 A | * | 8/1995 | Jackson | 341/143 |
| 5,821,891 A | * | 10/1998 | Shi et al. | 341/143 |
| 5,917,440 A | * | 6/1999 | Khoury | 341/143 |
| 5,982,315 A | * | 11/1999 | Bazarjani et al. | 341/143 |
| 5,995,036 A | * | 11/1999 | Nise et al. | 341/172 |
| 6,111,531 A | * | 8/2000 | Farag | 341/143 |
| 6,278,394 B1 | * | 8/2001 | May | 327/303 |

* cited by examiner

*Primary Examiner*—Michael Tokar
*Assistant Examiner*—Linh Van Nguyen
(74) *Attorney, Agent, or Firm*—Merchant & Gould P.C.

(57) ABSTRACT

The present invention provides a delta-sigma-modulator for converting an external analog signal to a digital out-put signal. The delta-sigma modulator comprises a first filter circuit, a second filter circuit, a one-bit quantization, a multi-bit quantization, a digital-to-analog converter, and a digital filter. The first filter circuit outputs a first analog signal according to the external analog signal and an one-bit output signal. The second filter circuit outputs a third analog signal according to the first analog signal and a second analog signal. The one-bit quantization converts the third analog signal into the one-bit output signal. The multi-bit quantization converts the third analog signal into a multi-bit output signal. The digital-to-analog converter comprises a plurality of capacitors, and determines the number of capacitors to be charged according to the multi-bit output signal, then selects the capacitors to be charged in a predetermined turn and charges the capacitors. When the digital to analog converter receives the alternate multi-bit output signal, the digital to analog converter selects the capaciters in a turn reversing to the predetermind turn and charges the selected capacitors which number corresponds to the multi bit output signal, to generate the second analog. The digital filter converte the one bit output signal and the multi-bit output signal to the digital output signal.

6 Claims, 10 Drawing Sheets

DELTA-SIGMA MODULATOR

BACKGROUND OF THE INVENTION

1. Field of the Invention

The present invention relates in general to a delta-sigma modulator. In particular, the present invention relates to a bandpass delta-sigma modulator for reducing multi-bit feedback error.

2. Description of the Related Art

In wireless communication, CMOS ICs are not only applied to digital signals in base frequency, but also in intermediate frequency and radio frequency. Therefore, many kinds of circuits are combined in an IC, which solves the problems of integrating bipolar transistors and CMOS transistors.

Presently, bandpass delta-sigma modulators are applied to converting an intermediate frequency signal from analog to digital. The conventional bandpass delta-sigma modulator comprises two kinds of quantizers. One is a one-bit quantizer to eliminate the characteristic of the offset of the direct current, and the other is a multi-bit quantizer to raise the level of the amplitude of vibration to decrease the quatization error between each level.

The performance of delta-sigma modulators is sensitive to input noise, so one-bit DAC is fed back to its first stage due to its better linearity, and multi-bit DAC is fed back to the other resonators behind the first one for its better signal-to-noise ratio (SNR). That is, the one-bit signal at the output of the circuit is fed back to filter in the first stage to eliminate the error, and the multi-bit signal at the output of the circuit is fed back to filter in the second stage. Therefore, the output of the quantizers comprises one-bit and multi-bit noise shaping signals. Then, the one-bit noise shaping is converted by a digital circuit to eliminate the error and improve the performance of the circuit.

Unfortunately, the multi-bit feedback has its inherent elements mismatched caused by process variation, and these errors can be regarded as a quantized nonlinearly noise, which will affect the accuracy of the delta-sigma modulator.

Figure 1:
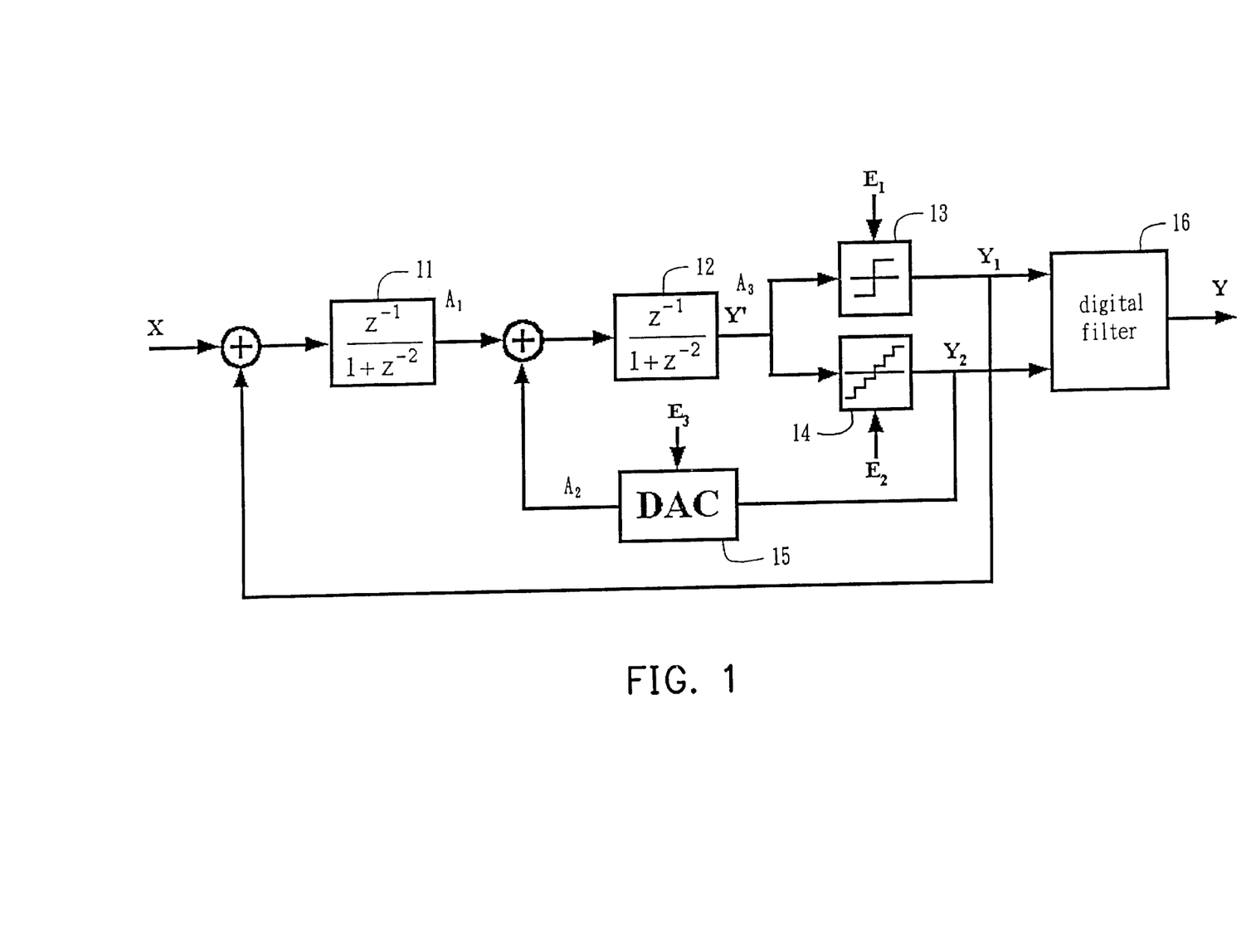
FIG. 1 shows the linear model of a two-stage bandpass delta-sigma modulator.

FIG. 1 shows the linear model of a two-stage bandpass delta-sigma modulator. In FIG. 1, x is used as the symbol for an input signal; $E_1$ and $E_2$ are used as the symbols for the quatization error of the one-bit quantizer 13 and multi-bit quantizer 14, respectively. $E_3$ is used as the symbol for the error of the DAC feedback loop; $Y_1$ and $Y_2$ are used as the symbols for the output of the one-bit quantizer 13 and multi-bit quantizer 14, respectively. In addition, the two bandpass filters (11 and 12) are used, the transfer function of the bandpass filters in z-domain are $$\frac{z^{-1}}{1+z^{-2}}.$$

Therefore, the ideal output of the linear model is $$Y = X \cdot z^{-2} + E_2 \cdot (1+z^{-2})^2 \qquad (1)$$

Because the multi-bit quatization error is less than the one-bit quatization error, the signal-to-noise ratio is strong at the output. However, formula (1) is only an ideal result, in fact, the error $E_3$ of the DAC feedback is ignored. If the bandpass filter 12 is Y', than Y' is $$Y' = X \cdot z^{-2} + E_1 \cdot z^{-2} + (E_2 + E_3) \cdot z^{-2}(1+z^{-2}) \qquad (2)$$

Therefore, the output $Y_1$ of the one-bit quantizer 13 and the output $Y_2$ of the multi-bit quantizer 14 are changed as:

$$Y_1 = Y' + E_1 = X \cdot z^{-2} + E_1 \cdot (1+z^{-2}) \cdot z^{-2} \cdot (1+z^{-2}) \qquad (3)$$

$$Y_2 = Y' + E_2 = X \cdot z^{-2} + E_1 \cdot z^{-2} + (E_2 + E_3) \cdot z^{-2} \cdot (1+z^{-2}) + E_2 \qquad (4)$$

Then, the signals $Y_1$ and $Y_2$ are input to digital filter 16. At this time, the formula (4) is multiplied by $(1+z^{-2})$, then minus formula (3) multiplied by $z^{-2}$, so the output Y is:

$$Y = X \cdot z^{-2} + E_2 \cdot (1+z^{-2})^2 + E_3 \cdot z^{-2} \cdot (1+z^{-2}) \qquad (5)$$

The formula (5) comprises DAC error $E_3$, which shows the influence by $E_3$ upon output Y. In formula (5), $E_3$ will increase the noise of output Y. Therefore, the noise shaping comprises one level, which will decrease the signal-to-noise ratio.

Therefore, if the levels of the noise shaping of $E_3$ and $E_2$ are the same, and the original feedback is kept, the output signal Y will have better performance and signal-to-noise ratio.

According to formula (5), if $E_3$ is changed to $E_3 \cdot (1+z^{-2})$, the dynamic element selection circuit completes the $(1+z^{-2})$ function on the z-domain. The variable '$z^{-1}$' represents delaying a sample cycle in time-domain, the variable '+' represents repeating selection, and the variable '−' represents not repeating selection.

Hence, to obtain the selection capability of the $(1+z^{-2})$ function, the selected elements must be repeated with the one selected twice backwards, and the element selected twice forwards must be repeated with the selected elements. That is, two adjacent selections only relate to the selections made twice backwards and twice forwards, but there are no rules between them.

Figure 2:
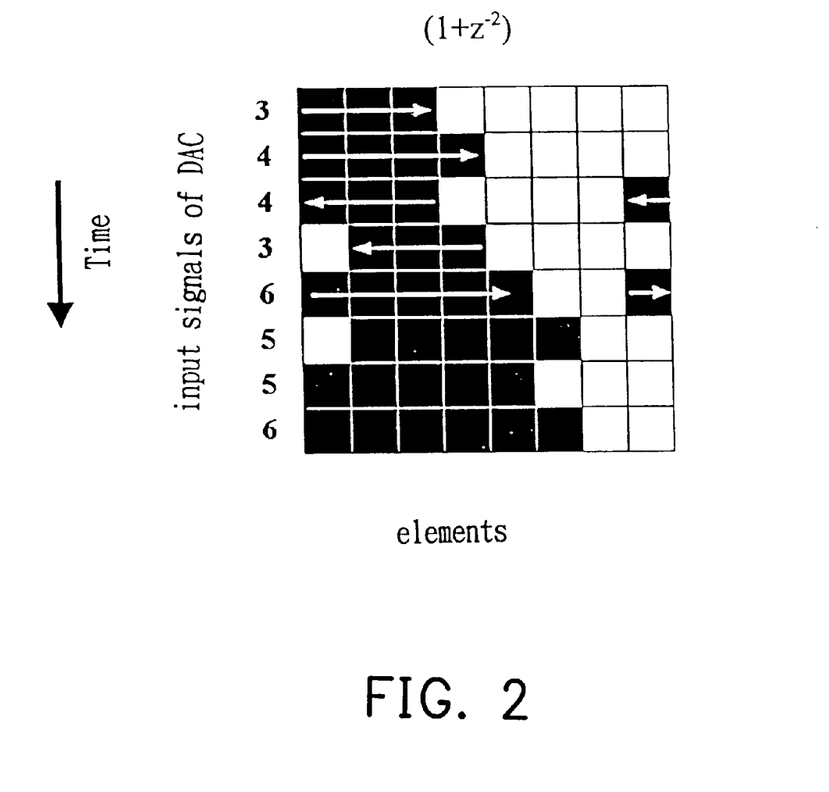
FIG. 2 shows the older of the elements selected by the DAC in an element matrix.

The input signals of DAC are separated from odd group and even group, each group is selected back and forth. For example, in FIG. 2, if the input sequence of DAC is 3, 4, 4, 3, 6, 5, 5, and 6. The odd times input are 3, 4, 6, and 5, and the even times input are 4, 3, 5, and 6. The first time the DAC selects three elements from left to right, and the second time the DAC still selects four elements from left to right. At the third time, the DAC selects four elements from the last elements at the selection of the first time to the left. At the fourth time, the DAC selects three capacitors from the last capacitor at the selection of the second time to the left.

Therefore, there are four modes while the DAC is selecting:

(1). In the odd times of the selection, the selection is toward the right.

(2). In the odd times of the selection, the selection is toward the left.

(3). In the even times of the selection, the selection is toward the right.

(4). In the even times of the selection, the selection is toward the left.

The dynamic element selection changes the appearing frequency of the error of the elements by timing selection. For frequency-domain, a zero pole is added in the frequency band to eliminate the errors. For example, the zero pole of the function $(1+z^{-2})$ is at a quarter of the sampling frequency, which is the frequency of the signals.

SUMMARY OF THE INVENTION

The object of the present invention is to provide a delta-sigma modulator, which combines multi-feedback with one-level noise shaping. One dynamic element selection circuit is applied to the multi-bit feedback loop to minimize the DAC mismatch error. After digital circuit processing, the output nonlinearity error of the delta-sigma modulator is suppressed with second-order noise shaping for multi-bit quantized noise and the same order noise shaping for element mismatching one in multi-bit feedback loop.

To achieve the above-mentioned object, the present invention provides a delta-sigma modulator for converting an external analog signal to a digital output signal. The delta-sigma modulator comprises a first filter circuit, a second filter circuit, a one-bit quantization, a multi-bit quantization, a digital-to-analog converter, and a digital filter. The first filter circuit outputs a first analog signal according to the external analog signal and a one-bit output signal. The second filter circuit outputs a third analog signal according to the first analog signal and a second analog signal. The one-bit quantization converts the third analog signal into the one-bit output signal. The multi-bit quantization converts the third analog signal into a multi-bit output signal. The digital-to-analog converter comprises a plurality of capacitors, which determines the number of capacitors to be charged according to the multi-bit output signal, then selects the capacitors to be charged in a predetermined turn and charge the capacitors. When the digital-to-analog converter receives the alternate multi-bit output signal, the digital-to-analog converter selects the capacitors in a turn the reverse of the predetermined turn and charges the selected capacitors, which number corresponds to the multi-bit output signal, to generate the second analog signal. The digital filter converts the one-bit output signal and the multi-bit output signal to the digital output signal.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

FIG. 1 shows the linear model of a two-stage bandpass delta-sigma modulator. In FIG. 1, x is used as the symbol for an input signal, $E_1$ and $E_2$ are used as the symbols for the quatization error of the one-bit quantizer 13 and multi-bit quantizer 14, respectively. $Y_1$ and $Y_2$ are used as the symbols for the output of the one-bit quantizer 13 and multi-bit quantizer 14, respectively.

The transfer function of the filter circuit 11 in z-domain is $$\frac{z^{-1}}{1+z^{-2}}.$$

The filter circuit 11 outputs a first analog signal $A_1$ according to the external analog signal X and a one-bit output signal $Y_1$ output from the one-bit quantization 13. The one-bit output signal $Y_1$ can combine with the external analog signal X after converting by a simple digital-to-analog converter (not show).

The transfer function of the filter circuit 12 in z-domain is $$\frac{z^{-1}}{1+z^{-2}}.$$

The filter circuit 12 outputs a third analog signal $A_3$ according to the first analog signal $A_1$ and the second analog signal $A_2$ output from the digital-to-analog converter 15.

The one-bit quantization 13 is coupled to the filter circuit 12. The one-bit quantization 13 converts the third analog signal $A_3$ into the one-bit output signal $Y_1$, and generates the quatization error $E_1$ during converting.

The multi-bit quantization 14 is coupled to the filter circuit 12. The multi-bit quantization 14 converts the third analog signal $A_3$ into a multi-bit output signal $Y_2$(take three bits for example), and generates the quatization error $E_2$ during converting.

The digital filter 16 is coupled to the one-bit quantization 13 and the multi-bit quantization 14 to convert the one-bit output signal $Y_1$ and the multi-bit output signal $Y_2$ to the digital output signal Y.

Figure 3:
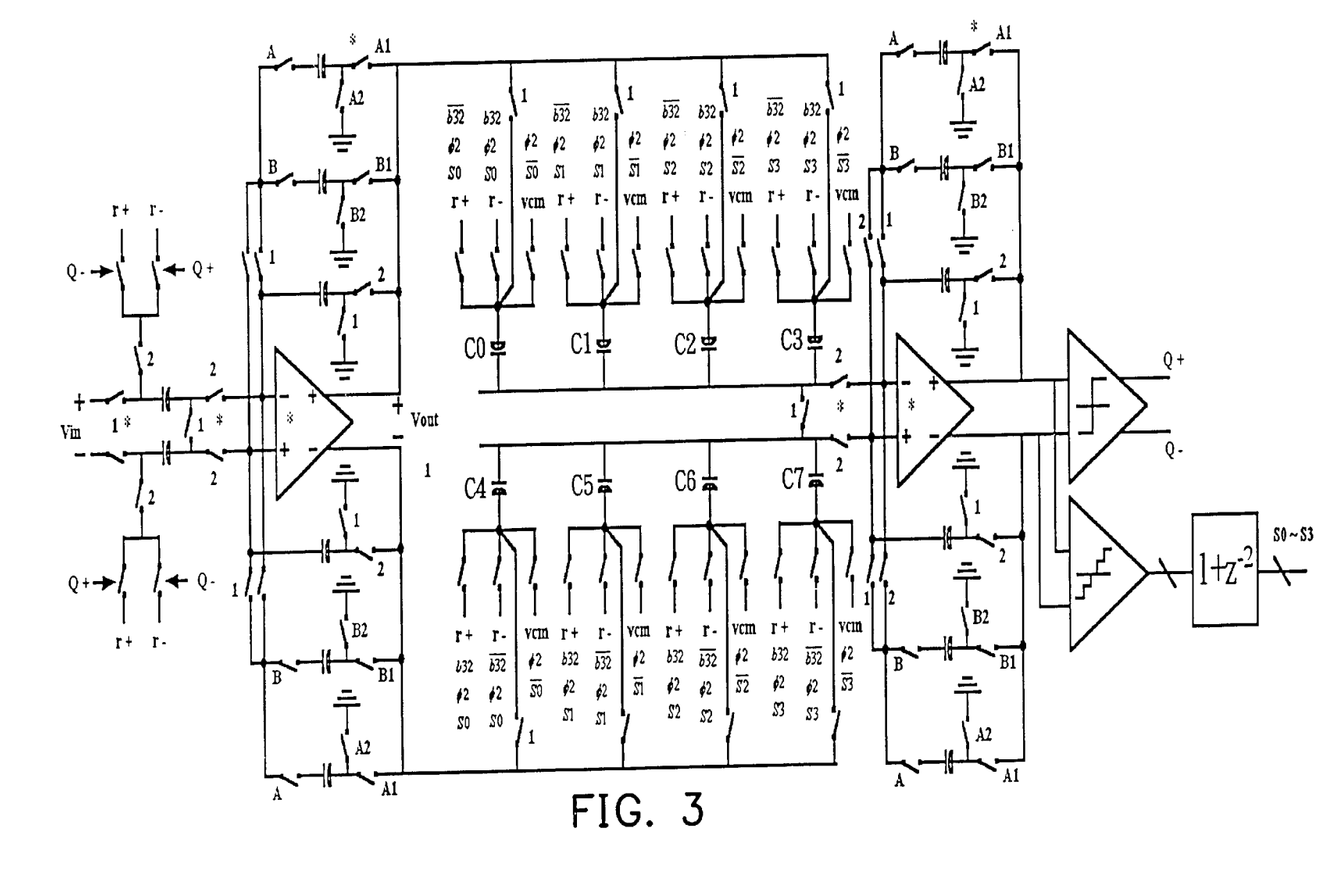
FIG. 3 shows the circuit diagram of the digital-to-analog converter 15 according to the embodiment of the present invention.
Figure 4:
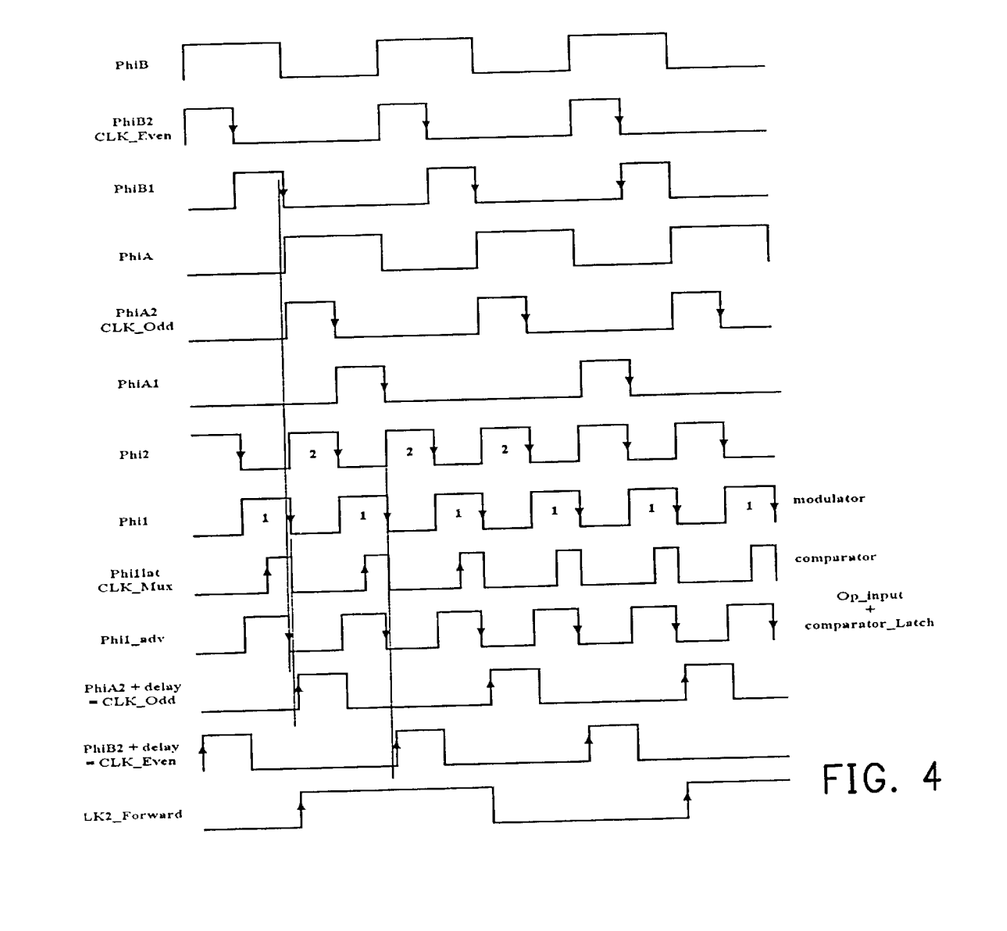
FIG. 4 shows the timing of the digital-to-analog converter 15 according to the embodiment of the present invention.

FIG. 3 shows the circuit diagram of the digital-to-analog converter 15 according to the embodiment of the present invention. FIG. 4 shows the timing of the digital-to-analog converter 15 according to the embodiment of the present invention. The digital-to-analog converter 15 comprises a plurality of capacitors C0~c7, the number of the capacitors is corresponding to the multi-bit output signal $Y_2$, in the embodiment of the present invention, the multi-bit output signal $Y_2$ is three bits, so there are eight capacitors in the digital-to-analog converter 15 ($2^3$).

The digital-to-analog converter 15 determines the number of the capacitors to be charged according to the multi-bit output signal $Y_2$, and then selects the capacitors to be charged in a predetermined turn and charge them, when the digital-to-analog converter 15 receives the alternate multi-bit output signal $Y_2$, the digital-to-analog converter 15 selects the capacitors in a turn reversing to the predetermined turn from the last selected capacitor and charges the selected capacitors, which number corresponds to the multi-bit output signal $Y_2$. Therefore the second analog signal $A_2$ is generated.

Figure 5:
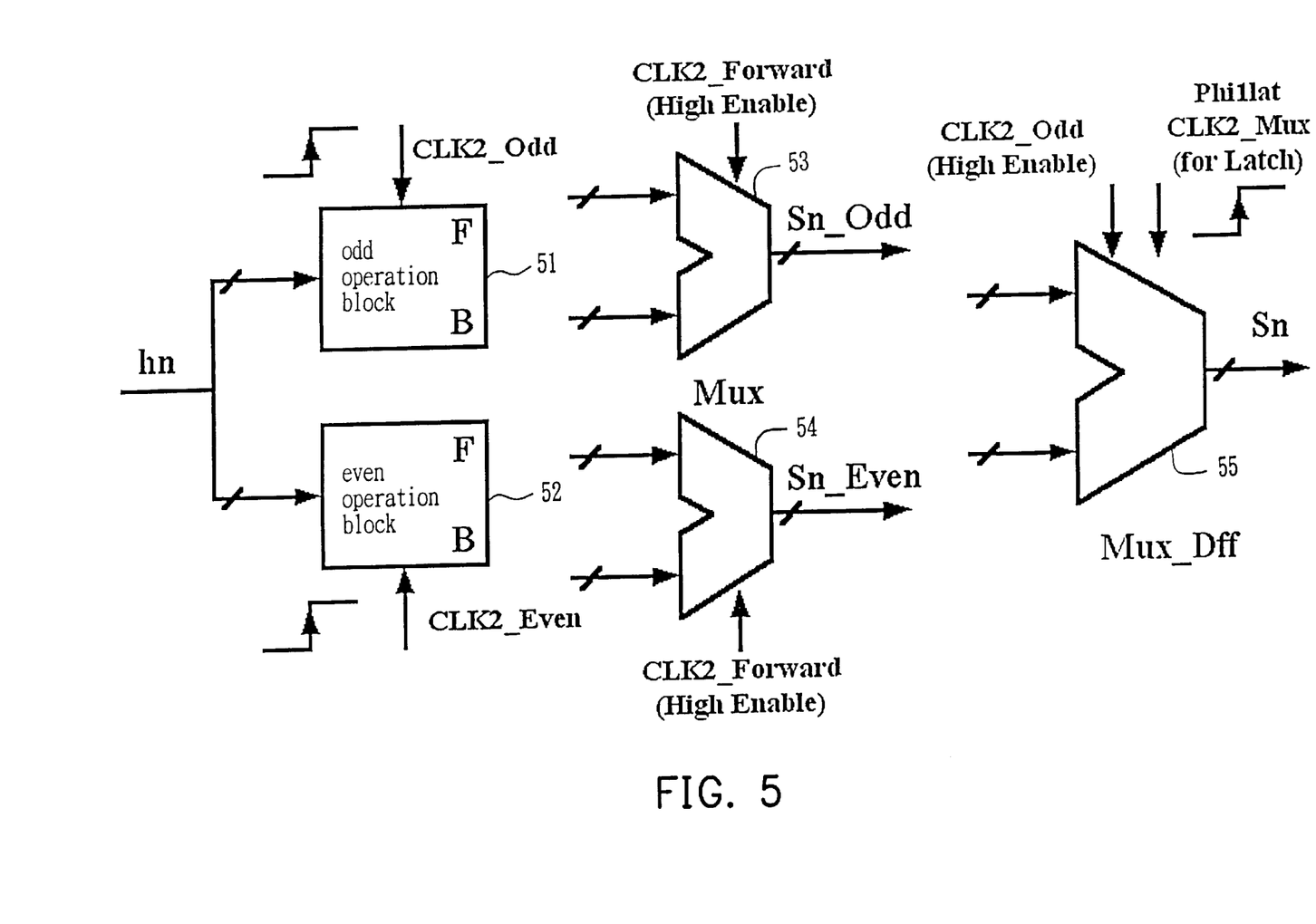
FIG. 5 shows the circuit to process the dynamic element selection function in the digital-to-analog converter 15.
Figure 6:
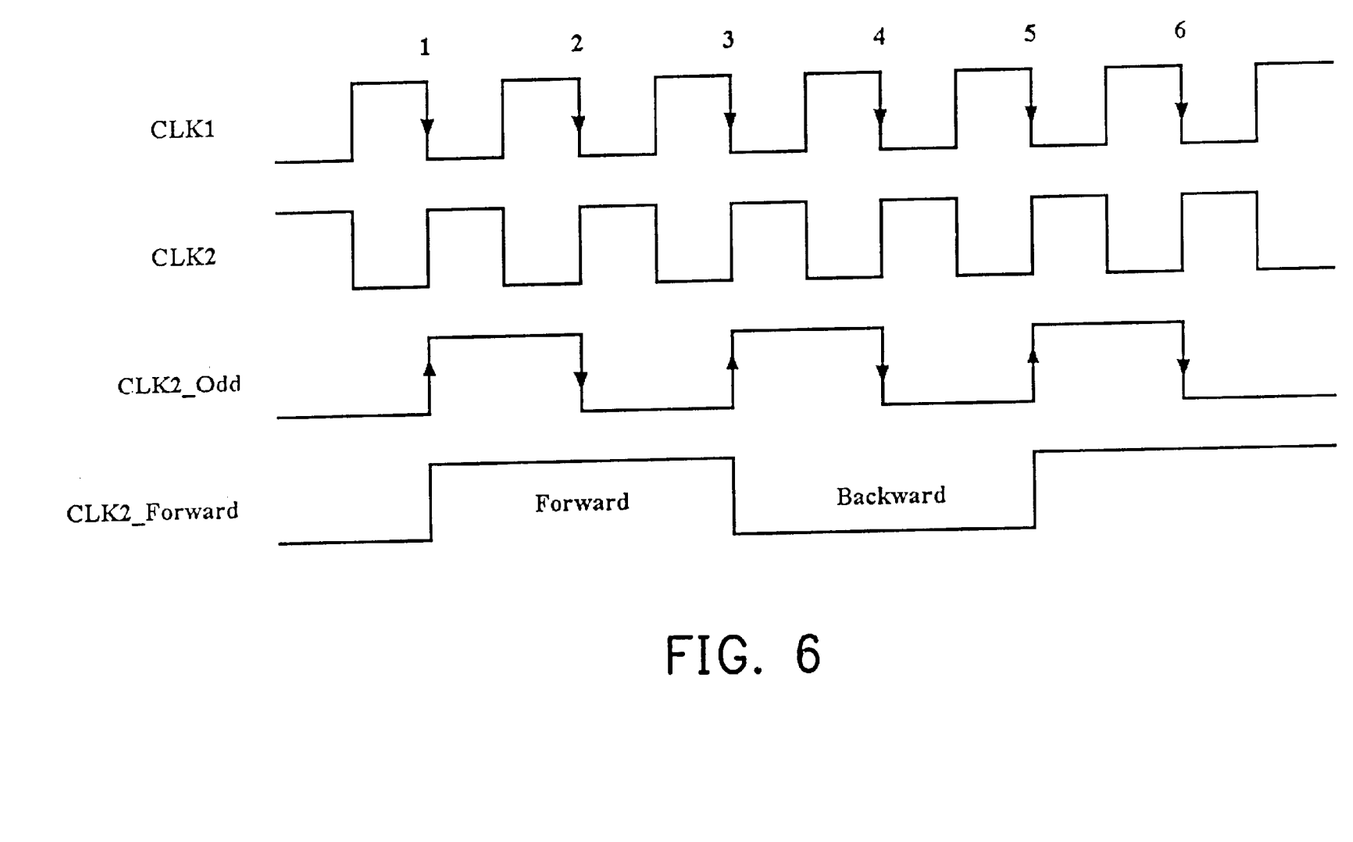
FIG. 6 shows the timing of the circuit in FIG. 5.

FIG. 5 shows the circuit to process the dynamic element selection function in the digital-to-analog converter 15. FIG. 6 shows the timing of the circuit in FIG. 5.

In FIG. 5, according to the present embodiment, the signals input in DAC 15 are separated into odd and even groups. The input signals are caught by clock signals CLK2__Odd and CLK2__Even. When the odd operation block 51 and even operation block 52 determine 10 the right-forward selection and the left-forward selection, the signals are input to multiplexers 53 and 54, and the elements are right-forward selected or left-forward selected according to the level of the CLK2__Forward signal. Finally, the signal Sn is output according to CLK__Odd.

FIG. 6 shows the timing of the clock signals CLK2_Odd and CLK2_Forward. There are four selecting modes in the four sequential sampling periods, which are separated by the clock signals CLK2_Odd and CLK2_Forward.

In the present embodiment, the multi-bit feedback loop of the DAC is added to the dynamic element selection, the dynamic element selection represented by the block "1+z$^{-}$2". In addition, a bandpass filter, composed of two switched capacitors, generates the operation function $$\frac{z^{-1}}{1+z^{-2}}$$

with the signals phi1, phi2, phiA, phiB, phiA1, phiA2, phiB1, and phiB2.

Figure 7:
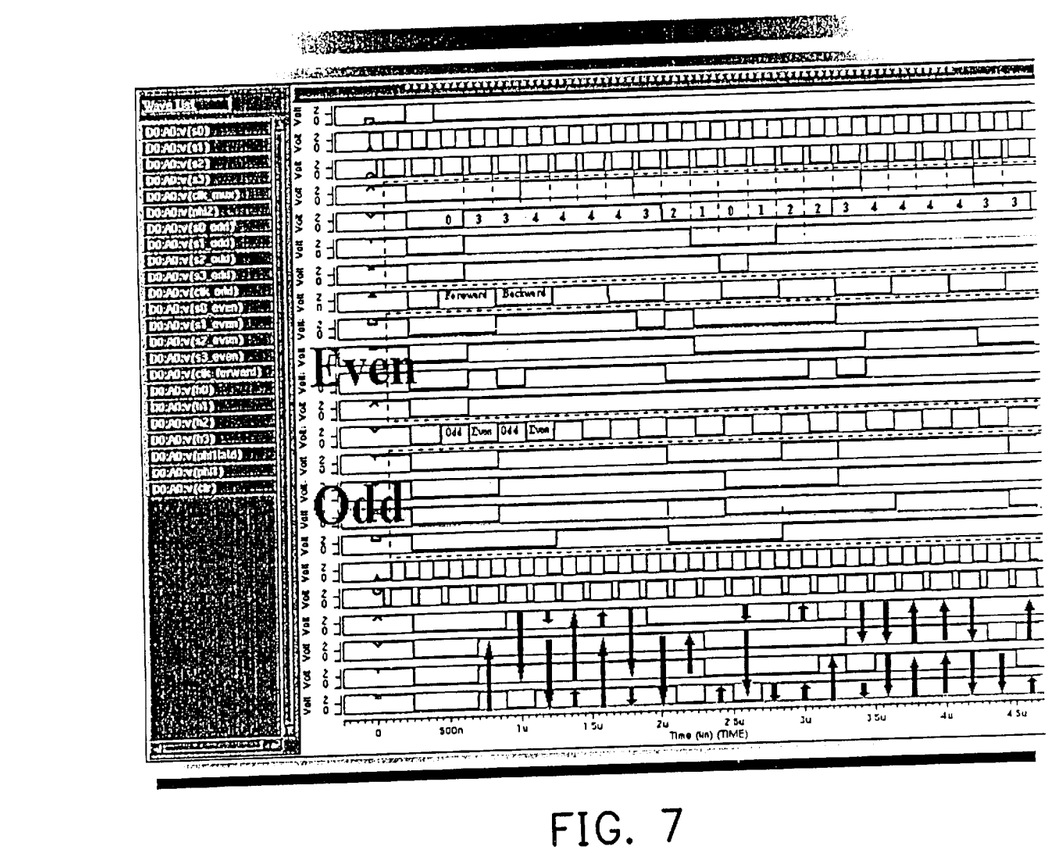
FIG. 7 shows the SPICE simulation of the dynamic element selection of the DAC.

FIG. 7 shows the SPICE simulation of the dynamic element selection of the DAC. The signals h0, h1, h2, and h3 represent the input of DAC, and the signals s0, s1, s2, and s3 represent the output of DAC. The arrow in FIG. 7 shows the selection following the four modes mentioned above.

Figure 8A:
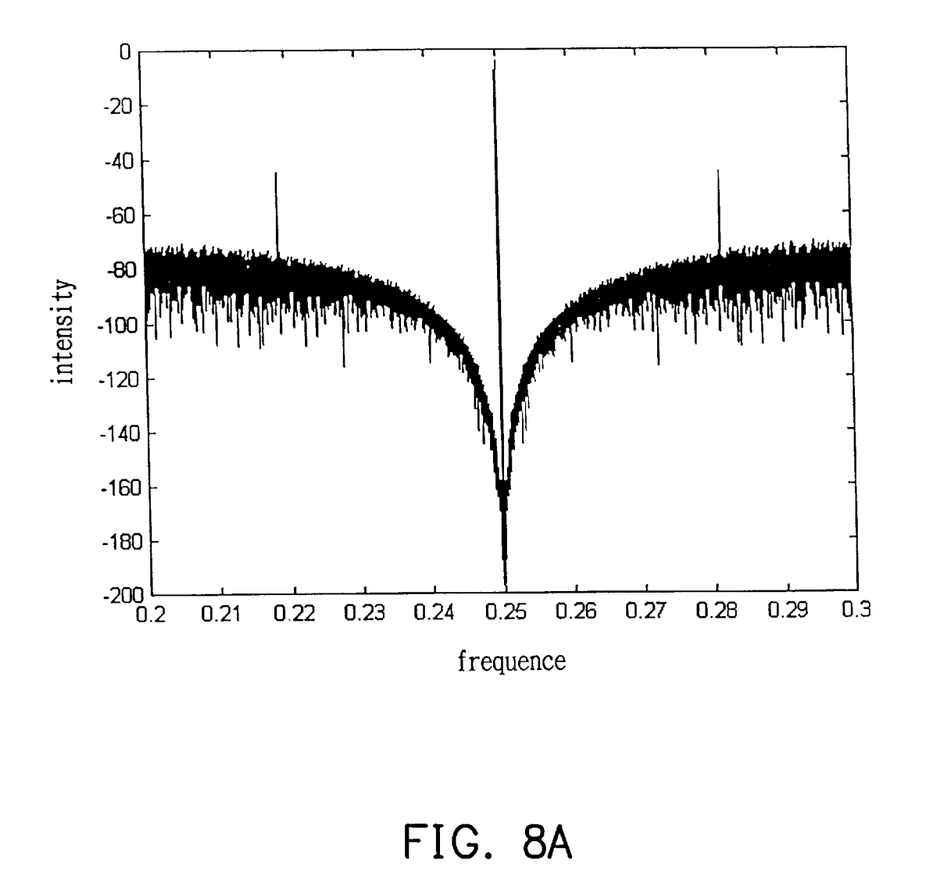
FIGS. 8A to 8C show the result of the MATLAB simulation.
Figure 8B:
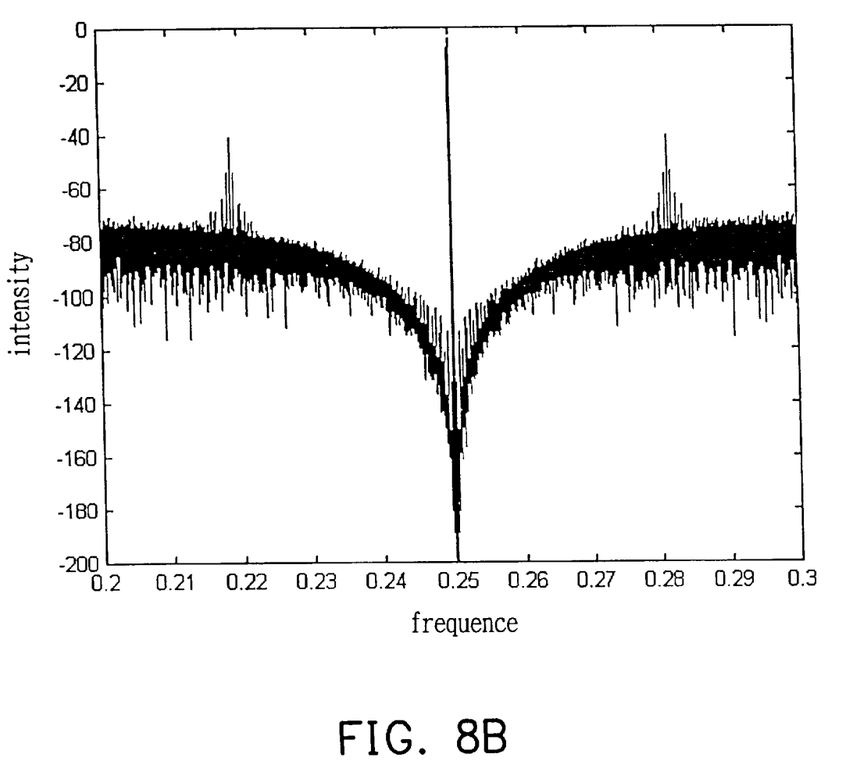
Figure 8C:
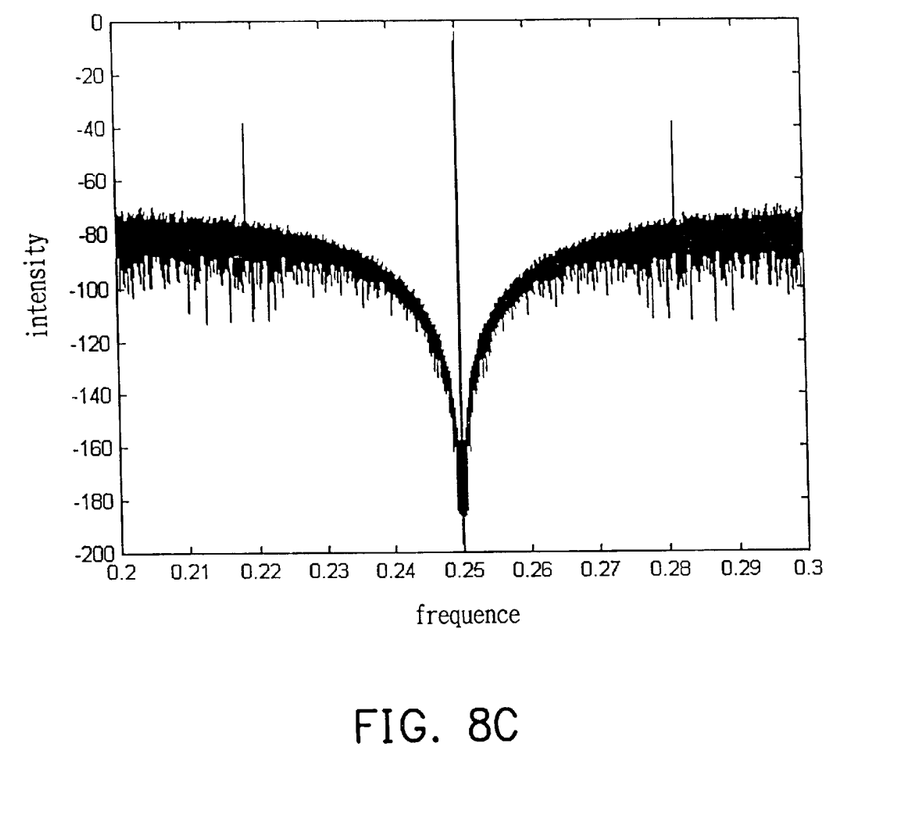

FIGS. 8A to 8C show the result of the MATLAB simulation, wherein the intensity of input signal is −1.15 dB, the frequency of input signal is 1.25 MHz, and the sampling frequency is 5MHz.

The output frequency spectrum of the DAC is shown in FIG. 8A. FIG. 8B shows the output frequency spectrum of the DAC when there is 1% mismatching. FIG. 8C shows the output frequency spectrum of the DAC according to the embodiment of the present invention. In FIG. 8C, the anti-noise ability of the delta-sigma modulator according to the present invention is improved.

Accordingly, the circuit provided in the present invention can be easily fabricated with standard CMOS technology due to its simple architecture. In this invention, a new structure is provided to reduce the element mismatching error of the DAC embedded in delta-sigma modulators. The circuit processes the merit of high performance of the multi-bit noise shaping, but no defect of the multi-bit feedback error, that enhance the output SNR effectively.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A delta-sigma modulator for converting an external analog signal to a digital output signal, comprising:
    a first filter circuit for outputting a first analog signal according to the external analog signal and a one-bit output signal;
    a second filter circuit for outputting a third analog signal according to the first analog signal and a second analog signal;
    a one-bit quantization, coupled to the second filter circuit, for converting the third analog signal into the one-bit output signal;
    a multi-bit quantization, coupled to the second filter circuit, for converting the third analog signal into a multi-bit output signal;
    a digital-to-analog converter comprising a plurality of capacitors, and determining the number of the capacitors to be charged according to the multi-bit output signal, and then selecting the capacitors to be charged in a predetermined turn and charging the capacitors, when the digital-to-analog converter receives the alternate multi-bit output signal, the digital-to-analog converter selecting the capacitors in a turn reversing to the predetermined turn and charging the selected capacitors, which number corresponds to the multi-bit output signal, to generate the second analog signal; and
    a digital filter coupled to the one-bit quantization and the multi-bit quantization to convert the one-bit output signal and the multi-bit output signal to the digital output signal.

2. The delta-sigma modulator as claimed in claim 1, wherein the transform function in z-domain of the first filter circuit $$\frac{z^{-1}}{1+z^{-2}}.$$

3. The delta-sigma modulator as claimed in claim 2, wherein the transform function in z-domain of the second filter circuit $$\frac{z^{-1}}{1+z^{-2}}.$$

4. The delta-sigma modulator as claimed in claim 3, wherein the transform function in z-domain of the operation of the digital-to-analog converter selecting the capacitors is 1+z$^{-2}$.

5. The delta-sigma modulator as claimed in claim 4, wherein the digital output signal is a three-bit signal.

6. The delta-sigma modulator as claimed in claim 5, wherein the number of the capacitors in the digital-to-analog converter is eight.

* * * * *